US008354583B2

(12) United States Patent
Zaban et al.

(10) Patent No.: US 8,354,583 B2
(45) Date of Patent: Jan. 15, 2013

(54) SOLAR CELLS ARRANGEMENT (75) Inventors: Arie Zaban, Shoham (IL); David Cahen, Rehovot (IL); Igor Lubomirsky, Petach Tikva (IL); Oscar M. Stafsudd, Los Angeles, CA (US)

(73) Assignees: Bar Ilan University, Ramat Gan (IL); Yeda Research and Development Company Ltd, Rehovot (IL); The Regents of The University of California, Oakland, CA (US)

( * ) Notice: Subject to any disclaimer, the term of this patent is extended or adjusted under 35 U.S.C. 154(b) by 480 days.

(21) Appl. No.: 12/301,399

(22) PCT Filed: May 30, 2007

(86) PCT No.: PCT/IL2007/000652
§ 371 (c)(1),
(2), (4) Date: Nov. 18, 2008

(87) PCT Pub. No.: WO2007/138589
PCT Pub. Date: Dec. 6, 2007

(65) Prior Publication Data
US 2010/0200044 A1    Aug. 12, 2010

Related U.S. Application Data (60) Provisional application No. 60/803,390, filed on May 30, 2006.

(51) Int. Cl.
*H02N 6/00* (2006.01)
*H01L 31/042* (2006.01)
*G02B 6/00* (2006.01)

(52) U.S. Cl. ......... 136/246; 136/251; 385/144; 385/900

(58) Field of Classification Search ............ 117/918
See application file for complete search history.

(56) References Cited

U.S. PATENT DOCUMENTS

| | | | |
|---|---|---|---|
| 4,078,944 A | | 3/1978 | Mlavsky |
| 4,204,881 A | * | 5/1980 | McGrew ............ 136/246 |
| 4,482,778 A | * | 11/1984 | Anderson ........... 136/246 |
| 4,884,860 A | | 12/1989 | Brown |
| 5,022,930 A | | 6/1991 | Ackerman et al. |

(Continued)

OTHER PUBLICATIONS

Bovard, Rugate filter theory: an overview, Applied Optics, vol. 32 No. 28, 1993, p. 5427-5442.*

(Continued)

*Primary Examiner* — Jennifer Michener
*Assistant Examiner* — Christopher Danicic
(74) *Attorney, Agent, or Firm* — Oliff & Berridge, PLC (57) ABSTRACT A solar energy conversion system is presented. The system comprises at least one waveguide arrangement having at least one light input respectively. The waveguide arrangement comprises a core unit for passing input solar radiation therethrough and a cladding material arrangement interfacing with the core therealong. The cladding material arrangement is configured as an array of spaced-apart solar cells arranged along the core unit and having different optical absorption ranges, such that an interface between the waveguide core and the cladding arrangement spectrally splits the photons of the input solar radiation by causing the photons of different wavelengths, while passing through the core unit, to be successively absorbed and thereby converted into electricity by the successive solar cells of said array.

31 Claims, 8 Drawing Sheets

U.S. PATENT DOCUMENTS

| | | | | |
|---|---|---|---|---|
| 5,089,055 A | * | 2/1992 | Nakamura | 136/246 |
| 6,140,570 A | | 10/2000 | Kariya | |
| 6,689,949 B2 | * | 2/2004 | Ortabasi | 136/246 |
| 7,206,142 B1 | * | 4/2007 | Wagner | 359/742 |
| 7,619,159 B1 | * | 11/2009 | Ortabasi | 136/246 |

OTHER PUBLICATIONS

Rühle et al., "Molecular Adjustment of the Electronic Properties of Nanoporous Electrodes in Dye-Sensitized Solar Cells," J. Phys. Chem. B., 2005, vol. 109, pp. 18907-18913.

* cited by examiner

The cell – side view

Figure 3B

Option: shaped waveguide

SOLAR CELLS ARRANGEMENT

FIELD OF THE INVENTION

This invention is generally in the field of solar energy conversion, and relates to a solar energy conversion system and method aimed at minimizing energy losses during the conversion process.

BACKGROUND OF THE INVENTION

Solar cells are photovoltaic devices that use semiconductors to convert photons into electrical energy. In a semiconductor, a conduction band and a valence band are separated by an energy gap Eg that varies with material composition and temperature. When a photon is absorbed by a semiconductor, an electron is promoted from the valence band into the conduction band, thereby creating a hole in the valence band. A photon of wavelength $\lambda$ and frequency $\nu$ has an energy $h\nu = hc/\lambda$ and is generally absorbed by a semiconductor when $h\nu \geq Eg$. However, any extra energy in the photon is converted into thermal rather than electrical energy, since only one electron-hole pair can be created for each absorption event. On the other hand, a semiconductor is more transparent to wavelengths corresponding to energies less than Eg, since in this case the photons are not energetic enough to promote electrons from the valence band into the conduction band. Thus, a single band gap-based system cannot exceed 32% conversion efficiency for untreated sunlight, since the most energetic photons produce largely thermal energy and are therefore inefficiently utilized, while the least energetic photons cannot be absorbed.

One technique for increasing the overall conversion efficiency is to use multiple cells with different band gaps to convert different parts of the illuminating solar spectrum, with each cell optimized for the restricted illuminating spectrum that it receives. This configuration called tandem cell configuration is a series of several cells each of which is optimized to a part of the solar spectrum, positioned one on top of the other, in a decreasing band gap order. The cells that make up the tandem can be grown individually and stacked together in a mechanical fashion, or the entire device may be grown monolithically using any of the known growth techniques (for example metal-organic chemical vapour deposition (MOCVD), molecular beam epitaxy (MBE), and liquid-phase epitaxy (LPE). Each cell in a mechanical stack requires its own substrate for growth, which increases the overall cost. Additionally, complex to engineering is required to provide good electrical connection to the stack, good thermal connections between the cells to dissipate heat which would otherwise reduce efficiency, and good optical connection between the cells. Overall, such cells tend to suffer from poor efficiency and poor reliability. For these reasons, monolithic stacks in which the cells are grown one on another on a common substrate are preferred. In a monolithic cell structure there is a requirement to create an ohmic electrical connection between the different band gap regions. This is achieved by the use of tunnel diodes between the cells so that the overall structure has only two electrical connections. The individual cells within the structure are connected in series so that the current through any cell is the same for all cells. This design leads to a current constraint whereby each cell must generate the same current for efficient operation. It is possible to design and optimize a structure for a particular spectrum, but when used in practice, such as in a terrestrial solar concentrator system, the spectrum will change throughout the day and throughout the year. This means that for much of the time the individual cells will not be current matched and the device efficiency will be reduced from the optimum value recorded when under the designed illumination spectrum. Furthermore, temperature variation is significant in a concentrator system so that the cell band gap variation will mean that the efficiency is reduced from the current matched optimum.

An alternative technique for increasing the overall conversion efficiency is to achieve the required spectral splitting using optics to deflect the correct part of the spectrum to the relevant cell. Spectral splitting consists of optical splitting of the incident illumination into several windows of energy ranges, each of which is suitable for cells that are optimized to the specific energy range. Unfortunately, this approach suffers from the difficulty in splitting the incident illumination over large areas because of the diffuse nature of the sunlight. Therefore, radiation concentrators are typically required.

Another technique for increasing the overall conversion efficiency is to use up- and down-conversion to convert two low energy photons to one of high energy, and split one high energy photon into two low energy ones, respectively, to make better use of the solar spectrum for a given bandgap system. However, even efficient use of both up-and down conversion, leads to only modest increases in solar-to-electrical energy conversion efficiency.

Another shortcoming of such solar cells, mainly amorphous silicon and molecular semiconductor (MSC) based systems, is the high internal resistivity of the photoactive materials. The process of photovoltaic energy conversion in molecular solar cells can be divided into three steps; creation of a movable electron/hole pair called an exciton in the MSC by light absorption, charge separation and charge collection at the two metal contacts. Usually charge separation occurs at the interface between the MSC and a hole (or electron) selective material that dissociates (quenches) excitons across the interface. To complete the circuit, the charges created at the MSC-quencher interface must be collected selectively at the metal contacts. Since the charge generated at the MSC-quencher interface has to travel across the MSC layer, the collection efficiency depends on the electrical resistivity of the MSCs. In other words, efficient charge separation requires long exciton diffusion length and high quality of the quencher-USC (Organic Semiconductor) interface, while efficient light conversion depends also on the electrical resistivity of the MSC layer. Moreover either short exciton diffusion length or high resistivity of the MSCs limits the thickness of the MSC layers in which the high quantum yield of the energy conversion process is maintained. Consequently, the overall optical density and thus the conversion efficiency of these solar cells are low.

Interpenetrating configurations, offering high interface area per illuminated area solve the exciton diffusion length problem, but often complicate the transport of the photo-generated charges.

GENERAL DESCRIPTION

There is a need in the art in optimizing conversion of solar energy into electricity, by providing a novel technique capable of guiding different fractions of incoming electromagnetic radiation to solar cell regions with different absorption spectra. The present invention provides for a novel waveguide arrangement configured as an array of solar cell regions of the absorption spectra, different spectral components of the input energy being thus processed (converted) successively by the different solar cell regions. The guiding of the electromagnetic radiation is carried out over large areas and utilizes spectrally-selective partially-transparent elements.

According to a broad aspect of the present invention, there is provided a solar energy conversion system comprising at least one waveguide arrangement having at least one light input, respectively. The waveguide arrangement comprises a core unit for passing input solar radiation therethrough and a cladding material arrangement interfacing with the core therealong. The cladding material arrangement is configured as an array of spaced-apart solar cells arranged along the core unit and having different optical absorption ranges, such that an interface between the waveguide core and the cladding arrangement spectrally splits the photons of the input solar radiation by causing the photons of different wavelengths, while passing through the core unit, to be successively absorbed and thereby converted into electricity by the successive solar cells of said array.

Preferably, the solar cells of the cladding arrangement are arranged in a descending order of their optical absorption energy threshold having light sensitive materials of different band gap.

The waveguides may be optically inhomogeneous such that the input radiation is successively directed to the different solar cells for optimal conversion of said radiation. In some embodiments of the invention, the interface between the waveguide core and the cladding arrangement is configured and operable to provide the spatial spectrum splitting in which the radiation is split into several windows of energy ranges. The waveguide arrangement may have an optical refractive index gradient along the core axis.

Preferably, the solar cells have thin light sensitive films (of about a few microns thickness, e.g. 2-5 microns).

In some embodiments of the present invention, the conversion system has a waveguide tandem configuration. The conversion system comprises at least one second waveguide structure interfacing with the cladding material arrangement of the first waveguide structure, each waveguide structure having its light input into the respective core. The waveguide arrangement may be wedge-shaped.

Preferably, the solar cells are perpendicular to the incoming radiation and the waveguide arrangement is configured as V-shaped grove.

The conversion system may comprise a spectral splitting element to provide a spectrum splitting of the input solar radiation between at least first and second waveguide arrangements. The spectral splitting element may be a dichroic mirror. The dichroic mirror may be integrated within at least one of the solar cells.

According to another broad aspect of the invention, there is provided a solar energy conversion system comprising at least one waveguide arrangement having at least one light input respectively, the waveguide arrangement comprising a core unit for passing input solar radiation therethrough and a cladding material arrangement interfacing with the core therealong, said cladding material arrangement being configured with a refractive index gradient along the core axis, the different refractive index regions of the cladding material arrangement being associated with the different solar cells, respectively.

According to yet another broad aspect of the invention, there is provided a solar energy concentrator comprising at least one waveguide arrangement having at least one light input respectively, the waveguide arrangement comprising a core unit for passing input solar radiation therethrough and a cladding material arrangement interfacing with the core therealong, said cladding material arrangement being configured with a refractive index gradient along the core axis, thereby spectrally splitting the photons of the input solar radiation by causing the photons of different wavelengths, while passing through the core unit, to be successively absorbed and thereby collected at the different refractive index regions of the cladding material arrangement.

According to yet another broad aspect of the invention, there is provided a method for optimizing conversion of solar energy into electricity. The method comprises directing an incoming radiation into at least one waveguide arrangement comprising a core unit for passing input solar radiation therethrough and a cladding material arrangement interfacing with the core therealong, said cladding material arrangement being configured as an array of spaced-apart solar cells arranged along the core axis and having different optical absorption ranges, such that an interface between the waveguide core and the cladding arrangement spectrally splits the photons of the input solar radiation by causing the photons of different wavelengths, while passing through the core unit, to be successively absorbed and thereby converted into electricity by the successive solar cells of said array; thereby enabling maximization of the efficiency conversion process in which the energy spectrum of the solar radiation is absorbed by the surrounding solar cells.

The method also comprises guiding different fractions of incoming radiation having different wavelength range to different solar cells.

In some embodiments of the invention, the method comprises providing spatial spectrum splitting. The waveguide arrangement may be configured as series of prisms. The spectral splitting may be provided by a dichroic mirror.

The method also comprises selectively modifying parameters selected from the relative refractive indexes at the waveguide-solar cell interface, the band gap of said solar cells, the length of each solar cell and the absorption window to optimize the absorption of the incoming radiation. The relative refractive indexes at said waveguide-solar cell interface may be varied by different optical coupling coating between said waveguide and said solar cells. The spectral splitting of the incoming radiation into several windows of energy ranges may be provided by a gradual variation of the waveguide refractive index.

Preferably, the waveguide refractive index may be selectively modified in the direction perpendicular to that of the incoming radiation towards a given wavelength.

In some embodiments of the invention, the solar cells have independent electrical circuits to decrease electrical losses and eliminate the current matching between said solar cells.

In some embodiments of the invention, the electromagnetic radiation is directed onto an additional solar cell with lowest optical absorption threshold, attached to said waveguides at an optimal angle to the other cells. The electromagnetic radiation may be directed into the waveguides via mirrors or lenses. The waveguides may be folded in multiple sheets or rolled in a spiral to decrease the space. These sheets or rolls may be encapsulated in vacuum or inert gas; or may be encapsulated in electrolyte forming an electrochemical system.

Some of the cells can be replaced for maintenance or due to a difference in their lifetime.

The invention also provides a method of encapsulation of solar cells using end-sealed glass tubes of various cross-sections, optimized for radiation collection. The tubes may be evacuated, filled with inert gas or may be filled by a chemically inert liquid, the optical properties of which match those of the tubes in an optimal fashion, The outer surface of the tubes may be modified for passive or active self-cleaning. The tubes may be equipped with light-collecting mirrors.

The tubes may be arranged so as to be tilted with respect to the horizon for optimal solar radiation collection. Such optimal conditions may be achieved by rotating the tubes around their axes.

The tubes may be arranged to form unified modules permitting separate tube replacement.

The cells may be electrically connected to independent electrical circuits. The electrical current produced by each of them can be managed and utilized separately, which decreases electrical losses and does not require current matching between the cells. The independent electrical connection of the cells also decreases the losses due to the seasonal and daily changes in the solar spectral characteristics.

BRIEF DESCRIPTION OF THE FIGURES

In order to understand the invention and to see how it may be implemented in practice, and by way of non-limiting example only, with reference to the accompanying drawing, in which FIG. 1 schematically illustrates the reflection process occurring in a conventional waveguide.

DETAILED DESCRIPTION OF PREFERRED EMBODIMENTS

The configuration and operation of the conversion system and the method for optimizing the conversion of solar energy into electricity used therein can be better understood with reference to the drawings, wherein like reference numerals denote like elements through the several views and the accompanying description of non-limiting, exemplary embodiments.

Figure 1:
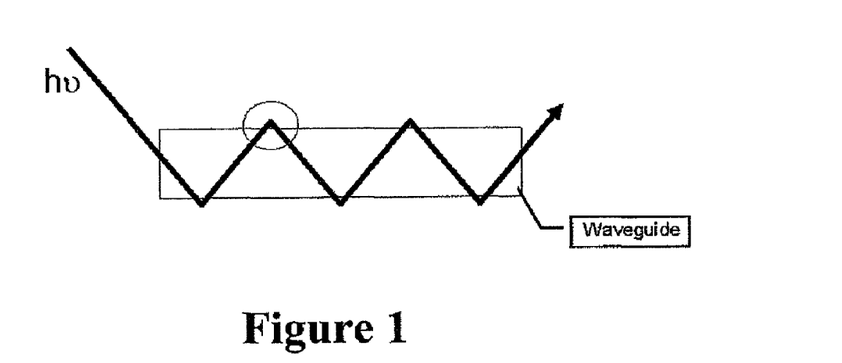

The present invention in its one aspect takes advantage of the effect of total internal reflection of light propagating along a waveguide, for constructing a solar cell arrangement. The total internal reflectance results from the difference in refractive indexes at the waveguide core-cladding interface. This difference determines the critical angle at which all the light is reflected back into the waveguide. The reflection process occurs over a distance in the order of one half of the wavelength. In other words, in each reflection occurrence, the light penetrates the cladding material to a distance of approximately half its wavelength during the reflection. A schematic presentation of this reflection process is shown in a self-explanatory manner in FIG. 1.

Figure 2:
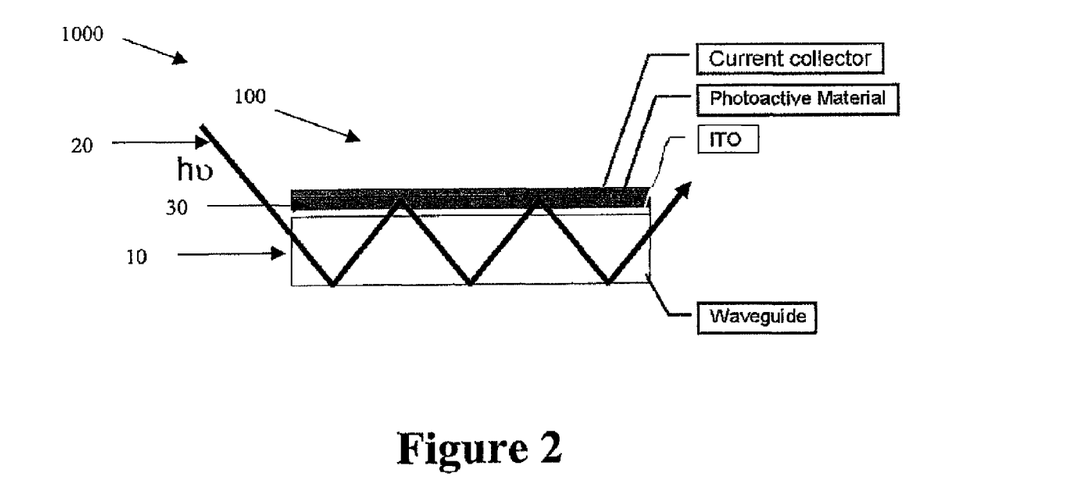
FIG. 2 schematically illustrates an example of a waveguide-based solar cell according to one embodiment of the present invention.

Reference is made to FIG. 2 illustrating a solar energy conversion system, generally designated 1000, including at least one waveguide arrangement 100, the single waveguide being shown in the present example, having a light input 20. The waveguide arrangement 100 includes a core unit 10 for passing input solar radiation 20 therethrough and a cladding material arrangement 30 interfacing with the core 10 therealong. The cladding material arrangement 30 is configured as an array of spaced-apart solar cells arranged along the core axis and having different optical absorption ranges, such that an interface between the waveguide core 10 and the cladding arrangement 30 spectrally splits the photons of the input solar radiation 20 by causing the photons of different wavelengths, while passing through the core unit 10, to be successively absorbed and thereby converted into electricity by the successive solar cells of said array.

Thus, the waveguide can be modified to the extent that for the visible region only the first 200-400 nm (or less if needed) of each cell will be illuminated. Unlike standard cells, here, photons that are not absorbed by the thin solar cell in the first pass through are not lost. The length of the surrounding solar cell and the properties of the waveguide ensure full collection of these photons. In other words, the waveguide-based solar cell (the waveguide arrangement having at least one array of solar cell regions of different absorption spectra) enables full collection of the incident photons while maintaining a thin, low resistance, efficient solar cell.

It should be noted that in this example, ITO is used as a transparent conductor, but it should be understood that the invention is not limited to this specific example. When light penetrates the waveguide it propagates while penetrating the surroundings (cladding material). If the surrounding is a solar cell, one can expect that the penetrating light will be converted into electricity. In other words, as light propagates via the waveguide, part of it is absorbed by the surrounding solar cell and converted into electricity. The exact light path and portion absorbed by the surrounding solar cell depend on the relative refractive indexes at the waveguide-solar cell interface and the band gap of the solar cell. This interface is designed so as to allow full absorption of the photons having high enough energy for the surrounding solar cell. However at the same time, the interface between the waveguide and the surrounding solar cell allows the photons of lower energy to propagate along the waveguide. Such a design may o include changes in the refractive index of the waveguide towards a given wavelength region, wavelength dependant scattering or other optical methods to affect the path of the photons based on their energy.

It should be noted that the term waveguide used herein does not limit the device configuration to a cylindrically shaped configuration. The device may be configured as a cylinder-like or substantially flat configuration.

Figure 3A:
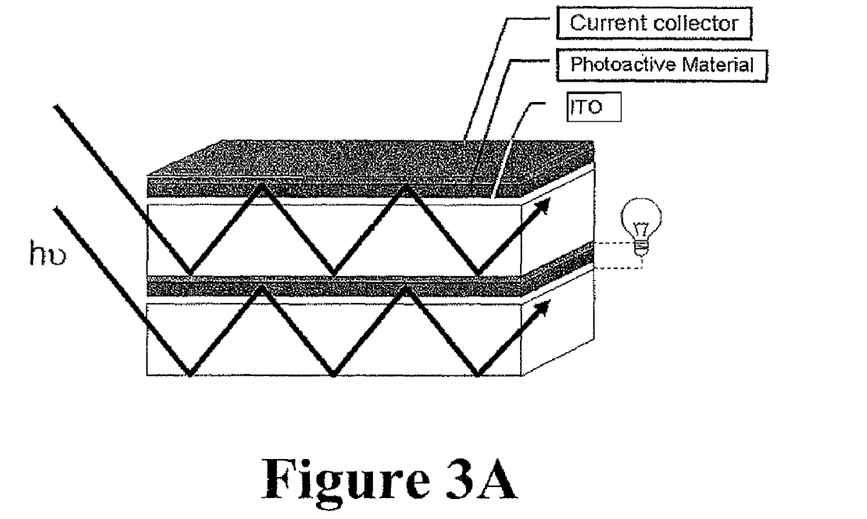
FIG. 3A to 3C schematically illustrate different structures in which examples of waveguide-based solar cells are stacked.
Figure 3B:
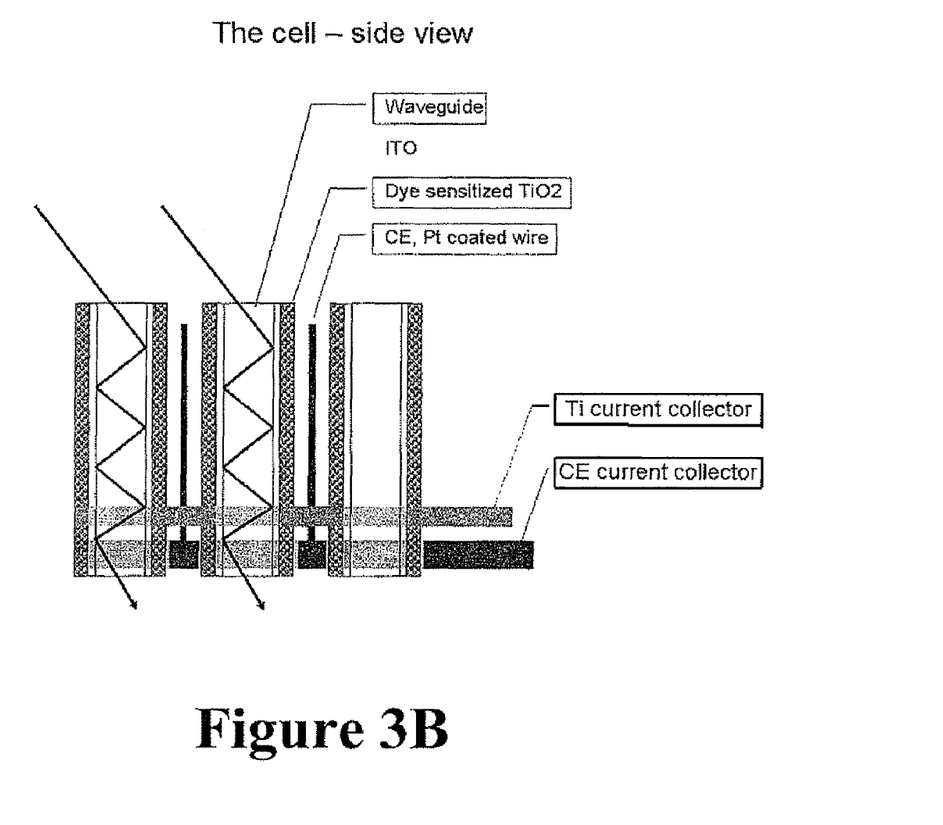
Figure 3C:
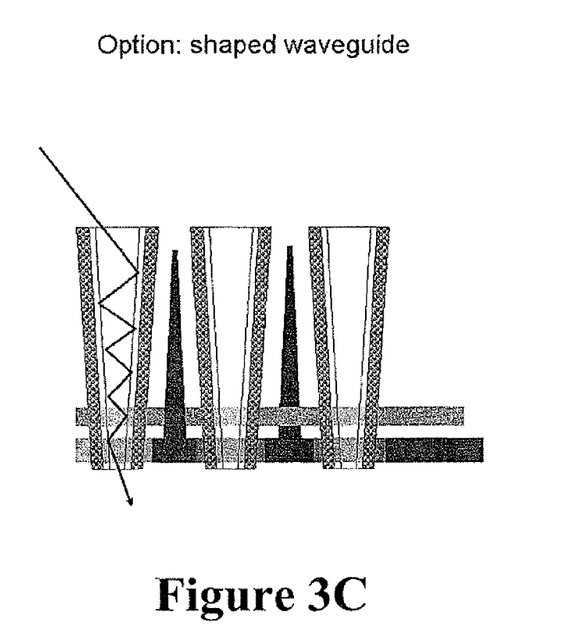

Reference is made to FIGS. 3A to 3C exemplify structures in which the waveguide-based solar cells are stacked.

Figure 4:
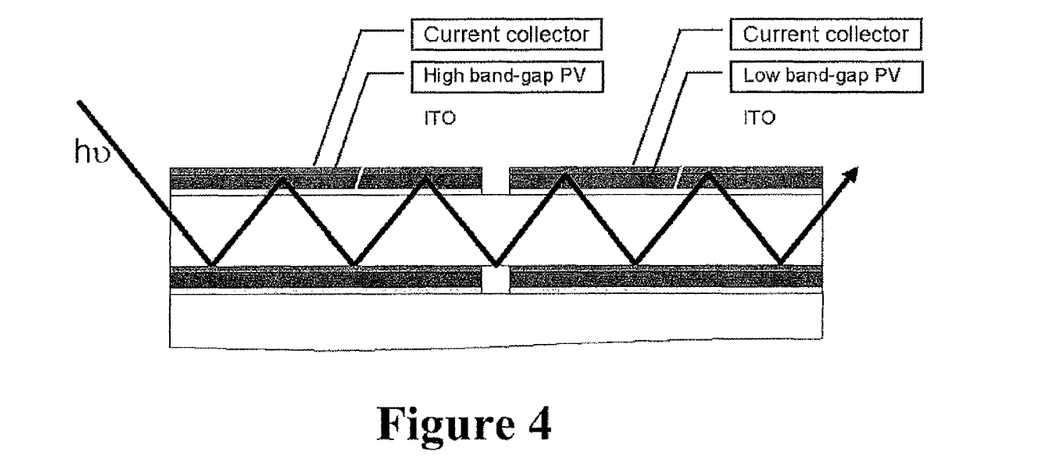
FIG. 4 illustrates several solar cells coupled in a waveguide tandem configuration.

According to one embodiment of the present invention, several solar cells may be coupled in the waveguide tandem configuration as illustrated in FIG. 4.

Light entering the system propagates in a waveguide next to a series of solar cells. The interaction between the light and the surrounding solar cell is limited to the photons that can be of use in that specific solar cell. The remainder of the illumination continues towards one of the following solar cells, finally allowing the low end photons an exit for a use in a thermal based system or as a mean to avoid heating.

Figure 5:
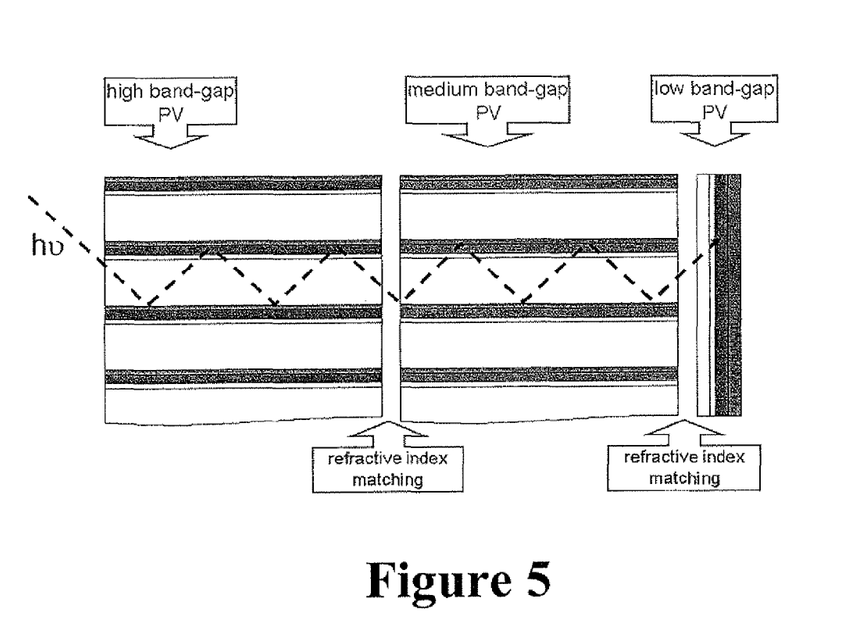
FIG. 5 illustrates the possible coupling of the light along several systems.

According to some embodiments of the invention, there is provided a system having multiple solar cells and having many degrees of freedom like length of each surrounding solar cell, absorption window, relative refractive indexes, etc, to allow optimization of each chosen set of surrounding solar cells. As shown in FIG. 5, the light can move along several systems using optical compatible glues, and the final solar cell can be positioned facing the light path in the traditional way.

Moreover, it should be noted that the solar cell of the waveguide-based solar cell system of the present configuration may be formed from thin layers (a few microns, 2-5 microns) preventing high internal resistance. The use of thin layers increases the cell's effectiveness.

According to another aspect of the invention, the optical waveguides can be used for direct spectrum splitting using the same principle as in graded index (GRIN) lenses but implemented with materials having strong wavelength dispersion. The waveguide can be designed as series of prisms that would lead to spatial spectrum splitting. Two parameters can be varied independently: first, the refractive index in each point of the waveguide, and second the reflection coefficient at the border between the solar cell and the waveguide.

It should be noted that the reflection coefficient at the border between the solar cell and the waveguide can be varied by using various optical coupling coatings between the waveguide and the solar cells. The spectral dispersion can be achieved in more than one way (more than one dopant) making this parameter that can be varied without deteriorating other desirable waveguide properties. Considering white light falling with a small angle variation on a waveguide having a gradient of refractive index in the direction perpendicular to that of the incoming radiation, light of different wavelengths is bent at the entrance to a different angle, if the material has any degree of optical dispersion. If the waveguide is long enough, the light coming from the side surfaces of the waveguide is spatially color-separated, because of the different optical path of the light of various wavelengths.

Figure 6A:
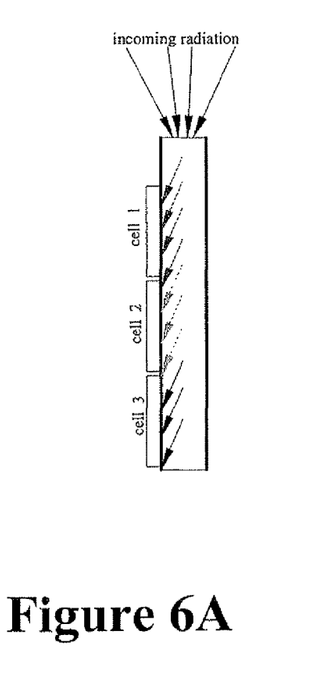
FIG. 6A illustrates spatial color splitting in a waveguide having an optical refractive index gradient according to one embodiment of the present invention.
Figure 6B:
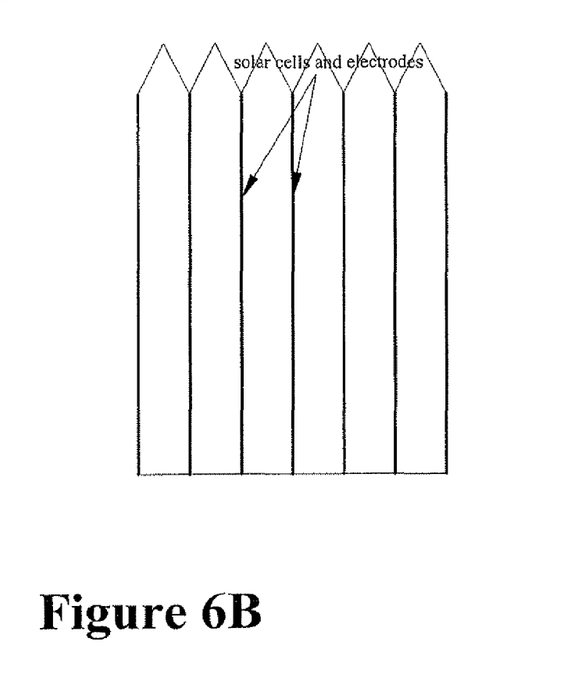
FIG. 6B illustrates a set of color-splitting waveguide-based solar cells having V-shaped top ends assembled in a stack.

Reference is made to FIG. 5 and to FIGS. 6A-6B which illustrates an example of a spatial color splitting configuration. FIG. 6A illustrates spatial color splitting in a waveguide having an optical refractive index gradient to yield wavelength dispersion. The internal reflection angle can be modified by changing the refractive index of the outer coating (the coating that couples light to the solar cells). It should be noted that the sequence of color splitting can be varied by tailoring the refractive index profile. FIG. 6B shows a set of color-splitting waveguide arrangement having V-shaped top ends assembled in a stack.

It should be noted that since the cells are perpendicular to the incoming radiation, the optical waveguides can form V-shaped groves (or curved V-shaped groves) with a multi-layer antireflection coating and graded refractive index within the V-shaped part of the plate. Such configurations are capable of operating in a wide optical range. The V-shaped groves are not necessarily symmetrical. For example, the shape of the waveguide end can take into account the position of the sun.

Figure 7A:
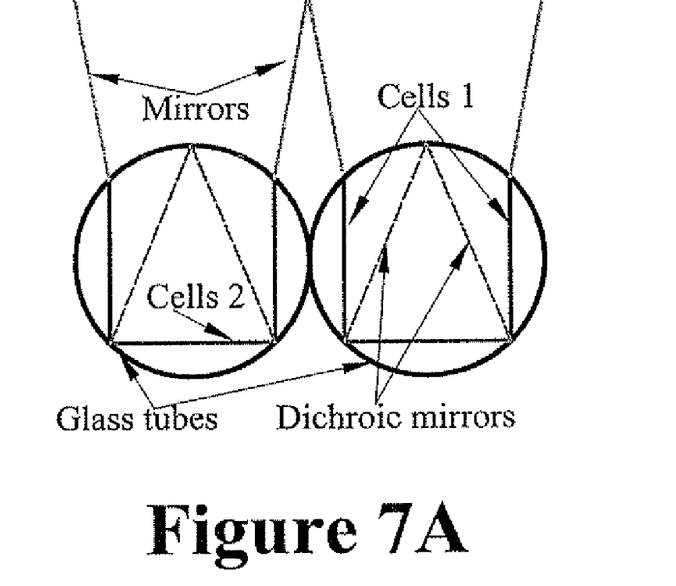
FIGS. 7A-7B exemplify an example of two-cell designs with parallel stacking of hollow tubes containing two types of cells and dichroic mirrors which provides spectrum splitting between the cells.
Figure 7B:
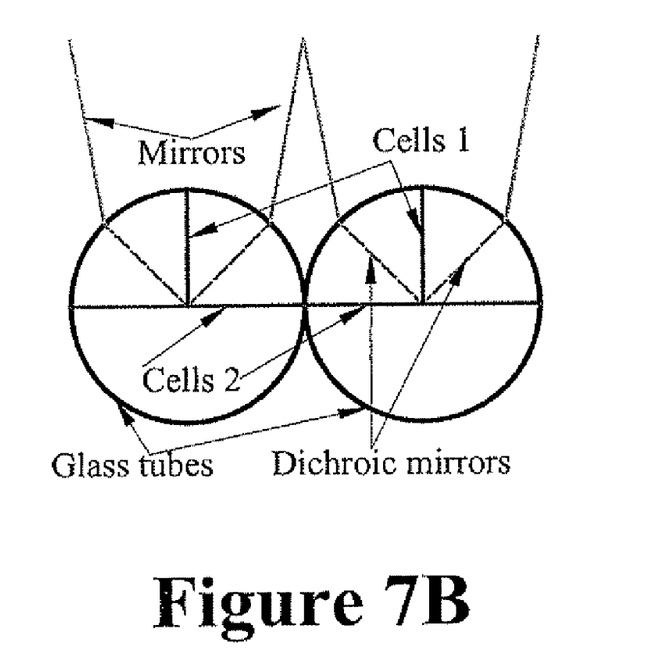

Reference is made to FIGS. 7A-7B exemplifying two-cell designs with parallel stacking of hollow tubes containing two types of cells and dichroic mirrors providing spectrum splitting between the cells. FIG. 7A illustrates a two-cell arrangement, containing parallel stacking of hollow tubes in which inverted V-shaped dichroic mirrors are placed. The tubes can be sealed and filled with an inert gas that extends cell lifetime. The top mirrors collect diffuse light. The tubes and the mirrors can be made of glass, which simplifies maintenance and filters out UV radiation protecting plastic-made components from degradation. It should be noted that depending on a selected design, the dichroic mirrors can be integrated with one of the cells.

It should be noted that each stack, waveguide and cell on a waveguide can be replaced and repaired separately. Since the lifetimes of cells of different types may vary over a wide range, this provides a considerable advantage in terms of maintenance and recycling. The latter is especially important for cells containing Cd. In addition, this provides unprecedented flexibility for a system size: the number of waveguides in the stacks has no lower or upper limit. Thus, the system of the present invention can be used for huge industrial scale energy production as well as for house-hold size secondary power supplies.

Stack design solves the problem of thermal stress, because the stacks are free to expand in the direction of the incoming radiation. This eases the requirements for optical glue between the cells and the waveguides, and may strongly reduce aging.

Over time, the outer surfaces of any optical system get damaged by natural elements. The outer optical surfaces can be easily replaced by replacing the top parts of the waveguides or replacing the tubes. One can also envision ways to do so without disassembling the stacks. This may be a decisive factor in desert areas.

Figure 8A:
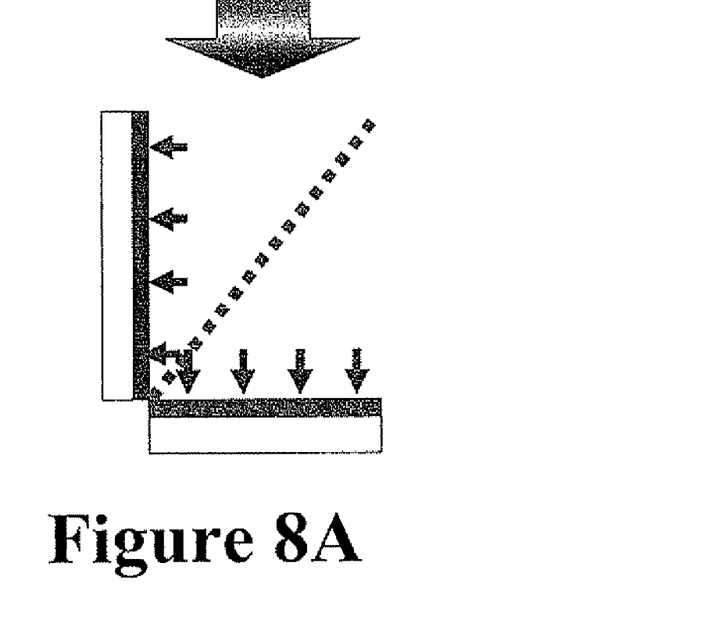
FIGS. 8A-8B show a general scheme of two optional configurations using a dichroic mirror that splits the solar radiation into high and low energy regions and two solar cells that are optimized for these regions.
Figure 8B:
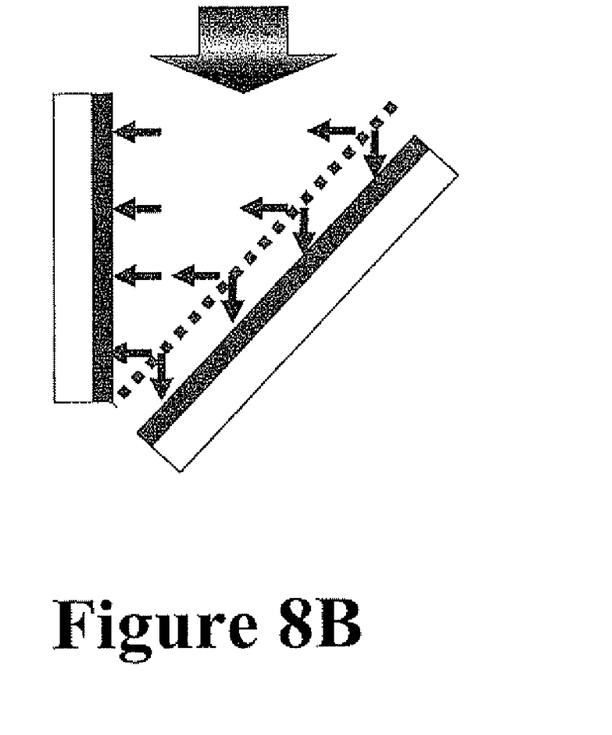

The stacks are not required to have large mechanical strength or perfect optical properties. Therefore, they can be manufactured by a process, such as sol-gel, that significantly simplifies tailoring of refractive index and dispersion ratio. According to another aspect of the invention, wherein the interface between the waveguide core and cladding is configured and operable to provide a spatial spectrum splitting in which the incoming radiation is split into several windows of energy ranges. The splitting of the solar irradiation to two energy windows followed by conversion to electrical energy by two energetically optimized solar cells is illustrated in FIGS. 8A-8B. Two optional configurations using a dichroic mirror that splits the solar irradiance into high and low energy regions and two solar cells that are optimized for these regions are shown. Unlike existing systems the spectral splitting here is done inside the conversion system, thus overcoming the disadvantages involved in using concentrators.

Preferably, the construction and sealing of the conversion system is based on glass tubes of different lengths (but always with a length several times its diameter).

The concepts of the above described inventive aspects were tested using dye sensitized solar cells (DSSCs). Third generation solar cells of the dye-sensitized, organic and polymer cell types, tolerate only thin layers of the photoactive materials. In dye-sensitized solar cells efficient charge separation occurs only from dye molecules that are attached directly to the semiconductor, while in organic and polymer solar cells the thickness of the photoactive material should not exceed the exciton diffusion length. Consequently, the optical density of these cells would be sub-optimal throughout the spectral window of the photoactive material. Typically, this problem is overcome by the use of 3-D interpenetrating arrangements of photoactive and carrier conducting material, in which the interfacial surface area is significantly larger than the projected area. This provides the desired high optical density with thin photoactive layers. While this approach solves the optical density issue, the interpenetrating configuration increases the distance the separated charges need to travel to the current collectors. Therefore, current collection starts to limit cell performance. To overcome this problem, cells will often have, again, sub-optimal optical density of the absorber and, thus, will utilize the solar irradiation incompletely.

The inventors of the present application have developed a new generic configuration for these types of cells that allows efficient energy conversion also over the spectral regions where the absorption coefficient of the photoactive material is low. Consequently the effective spectral response of the solar cells is extends over a wider spectral range than what would be the case in a standard configuration. This approach opens the way to better matching between the solar spectrum and the absorption spectra of these types of cells.

A currently available cell type suitable for utilizing the high energy part of the spectrum, namely the dye sensitized solar cell (DSSC), with an effective absorption edge around 2 eV was used. For the low energy part, polycrystalline Si cells or, even better, $CuInSe_2$-based cells among currently available cells, can be used. It should be noted that while currently state of the art systems are designed for maximal efficiency over the whole spectrum, the splitting suggested by the present invention requires cells optimized over a limited spectral range.

For optimal choice of cells for each spectral window, both the low and high energy cells to be used in the conversion system were developed for use as single cells. Special care is given to an increase of the operating voltage. The use of the spectral range that matches the peak absorption of the dye requires less dye and a thinner nanoporous electrode. This provides free surface that can be used to push the conduction band potential negatively and consequently increases the operating voltage.

Various parameters that significantly affect the final cost of energy need to be considered. These include the properties of the dichroic mirror (energy position and sharpness of the change from transparency to reflection), the angle between the cells and between the cells and the mirror.

Considering the above-described concept, optimization of this configuration included examination of the conversion system's position inside the tube and calculations of the possible gains or losses resulting from its placement inside the tube, including the position of the tube with respect to the sun and the reflection losses; antireflection coatings; influence of the refractive index of the tube; the use of the curved tube surface as low concentration lens; the atmosphere inside the tube and its influence on thermal balance; estimation of thermal stresses in the tubes (estimation of gas density fluctuations in the tubes and their influence on the optical properties); circular versus elliptical tube; use of varying curvature to decrease reflection.

With regards to dichroic mirrors, the following parameters should be taken into consideration: the influence of the quality of the dichroic mirror on the cell performance; and the minimal requirements for the dichroic mirror, namely position of the cut-off frequency, spectral width of the transition region and optical absorption in the various parts of the solar spectrum.

The following are some experimental results for the technique of the present invention.

The first experiment was aimed at the light harvesting and efficient use of photons in the proposed system. Thus high efficiency and the tandem concepts are not involved.

Figure 9:
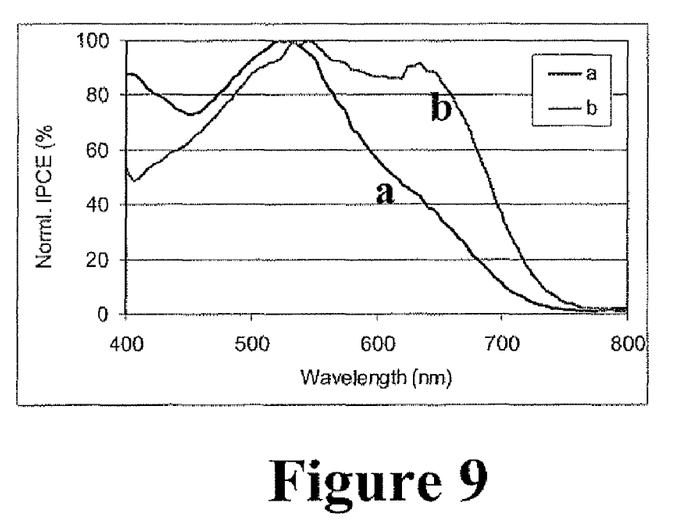
FIG. 9 shows the incident photon to current efficiency (IPCE) spectra of a solar cell as a function of the illumination path.

FIG. 9 shows the IPCE (incident photon to current efficiency) spectra of a DSSC as a function of the illumination path. Curve a present the IPCE of the cell under the standard perpendicular illumination, and curve b presents the IPCE spectrum obtained from the same DSSC but when the cell was illuminated via the glass substrate. The glass substrate acts as a flat waveguide. Both curves a and b are normalized to 100% at their peak value.

The results show that a waveguide based configuration allows better usage of the incident photons. This is due to a combination of high optical density (for all wavelengths) and short transport path of the photoinjected electrons.

Figure 10:
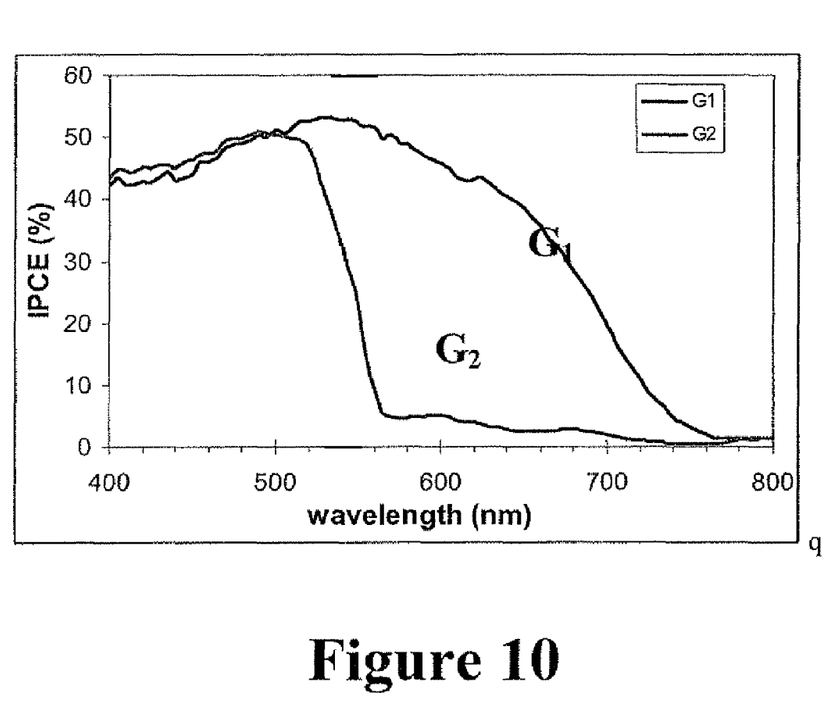
FIG. 10 shows two curves, $G_1$, corresponding to incident photon to current efficiency (IPCE) of a solar cell under standard conditions, and $G_2$, similar to $G_1$, but illuminated with long wavelengths, reflected by a dichroic mirror.

FIG. 10 shows two curves, $G_1$, corresponding to incident photon to current efficiency (IPCE) of a DSSC under standard conditions, and $G_2$, similar to $G_1$, but illuminated with long wavelengths, reflected by a dichroic mirror. This experiment was conducted using a conversion system containing a commercially available Si p/n solar cell and a Ru dye-sensitized solar cell (Ru-DSSC) with a dichroic mirror with a spectral cut-off around 540 nm. The results show that the dichroic mirror does not affect the cell performance above the cut-off energy (400-520 nm). Current-voltage measurements (not shown) show that despite the cut-off at 540 nm the DSSC maintained 50% of its conversion efficiency, while is at the same time the Si cell lost only 20% of its performance.

Figure 11:
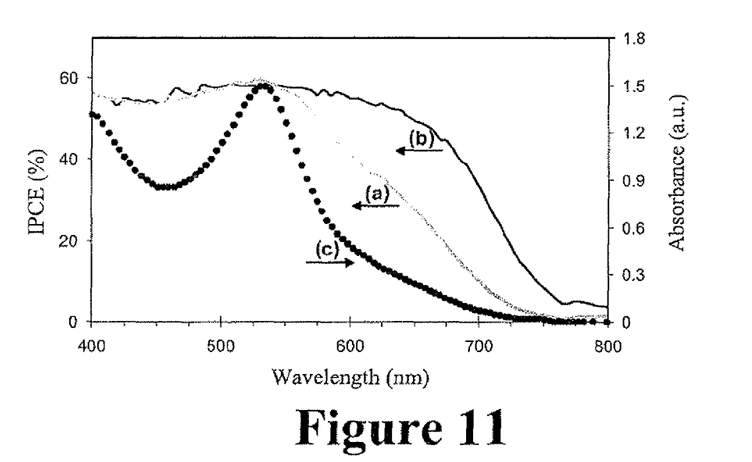
FIG. 11 shows the incident photon to current efficiency of a conversion system in which a solar cell is attached to a plate of window glass, which was illuminated from the side so as to serve as a light guide.

In a further experiment, a DSSC was attached to a plate of window glass, which was illuminated form its side so as to serve as a light guide. The results are shown in FIG. 11. Curve (a) shows the current-wavelength characteristics of the light guide based DSSC in terms of internal photon to current conversion efficiency (%). For comparison similar graph (b) is shown for the same cell, but now illuminated directly. Clearly the spectral response of the former is significantly better than that of the latter. Curve (c) shows the optical absorption of the cell.

Figure 12:
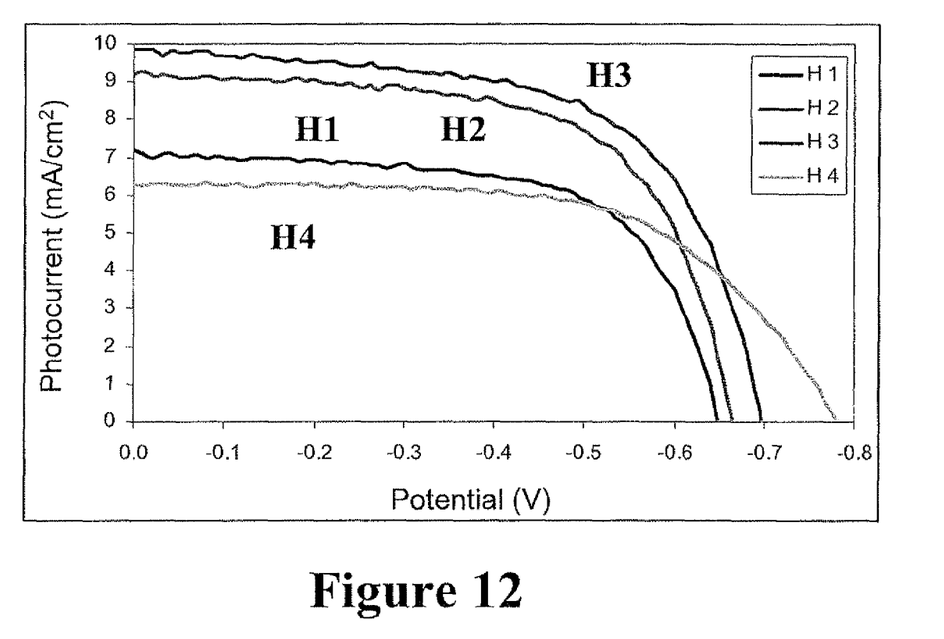
FIG. 12 shows the J-V characteristics of the cells of different lengths.

In another experiment, a set of DSSCs was measured. Each DSSC was attached to a window glass plate with a given edge area, as in the above-described example. The cells were differed in their length, but were otherwise identical. The results are shown in FIG. 12. The J-V characteristics of the cells of 3, 4 and 5 cm length are shown—graphs $H_1$, $H_2$ and $H_3$. These characteristics are compared with those of the same cell, exposed to the same illumination (curve $H_4$), but now directly illuminated, i.e., without the light passing thorough the glass plate. All the currents are normalized to 1 $cm^2$. The very much improved currents are clearly seen. The decrease in voltage is due to the lower light intensity (per unit illuminated area) for the cells illuminated through the glass, as compared to the one illuminated directly. Still it is obvious that the maximum power point of the 4 and 5 cm long cells illuminated through the glass is higher than that of the directly illuminated cell.

The results presented in FIG. 12 further demonstrate the flexibility of the generic system described here, The length of the cell attached to the waveguide can be tailored to the properties of the solar cell and to the specific solar spectrum.

The invention claimed is:

1. A solar energy conversion system comprising:
   a substantially flat waveguide arrangement having a longitudinal core axis and having at least one light input and being configured to provide radiation propagation along the longitudinal core axis by effect of total internal reflection, the waveguide arrangement comprising:
a core unit for passing input solar radiation, received from the light input, along the longitudinal core axis of said core unit; and
a cladding material arrangement interfacing with the core unit along said longitudinal core axis of the core unit, said cladding material arrangement being configured as an array of spaced-apart solar cells having different band gaps and arranged in a descending order of their optical absorption energy threshold along the longitudinal core axis of said core unit to thereby successively interact with the radiation passing through said core unit along the longitudinal core axis, the solar cells having different optical absorption ranges, such that an interface between the core unit and the cladding material arrangement spectrally splits photons of the input solar radiation while propagating through the core unit along the longitudinal core axis by causing each of the solar cells to absorb photons of a different wavelengths, while reflecting photons of other wavelengths to allow their interaction with successive solar cells, resulting in that the input solar radiation is successively absorbed by said array of solar cells and thereby converted into electricity.

2. The conversion system of claim 1, wherein said waveguide arrangement is optically inhomogeneous such that portions of the input radiation of different spectral ranges are successively directed by the effect of total internal reflection to the different solar cells.

3. The conversion system of claim 1, wherein the interface between the core unit d the cladding material arrangement is configured and operable to provide spatial spectrum splitting in which said radiation is split into several windows of energy ranges.

4. The conversion system of claim 3, wherein said waveguide arrangement has an optical refractive index gradient along said core unit.

5. The conversion system of claim 1, having a waveguide tandem configuration.

6. The conversion system of claim 5, comprising at least one second waveguide structure interfacing with the cladding material arrangement of the first waveguide structure, each waveguide structure having its light input into the respective core.

7. The conversion system of claim 1, wherein said waveguide arrangement is wedge-shaped.

8. The conversion system of claim 1, wherein said solar cells are perpendicular to said incoming radiation and said waveguide arrangement is configured as V-shaped grove.

9. The conversion system of claim 6, further comprising a spectral splitting element to provide a spectrum splitting of the solar radiation between the inputs of said at least first and second waveguide arrangements.

10. The conversion system of claim 9, wherein said spectral splitting element is a dichroic mirror.

11. The conversion system of claim 1, comprising at least one dichroic mirror integrated within at least one of the solar cells.

12. The conversion system of claim 1, wherein the interface between the waveguide core and the cladding material arrangement is configured to define a difference in refractive indexes that determines a critical angle for the effect of total internal reflection defining the light reflection back into the core unit.

13. The conversion system of claim 12, wherein the back reflection of the light occurs over a distance in the order of one half of the wavelength of said light, such that said light penetrates the cladding material to a distance of approximately half its wavelength during said back reflection.

14. A solar energy conversion system comprising:
a substantially flat waveguide arrangement having a longitudinal core axis and having at least one light input and being configured to provide radiation propagation along the longitudinal core axis by effect of total internal reflection, the waveguide arrangement comprising:
a core unit for passing input solar radiation, received from said at least one light input, along the longitudinal core axis of said core unit; and
a cladding material arrangement interfacing with the core unit along said longitudinal core axis of the core unit, said cladding material arrangement being configured as an array of spaced-apart solar cells having different band gaps and arranged in a descending order of their optical absorption energy threshold having a refractive index gradient along the longitudinal core axis of said core unit to thereby successively interact with the radiation passing through said core unit along the longitudinal core axis, such that the different refractive index regions of the cladding material arrangement being associated with different solar cells, respectively, to thereby spectrally split photons of the input solar radiation while propagating through the core unit along the longitudinal core axis by causing each of the solar cells to absorb photons of a different wavelength, while reflecting photons of other wavelengths to allow their interaction with successive solar cells, resulting in that the input solar radiation is successively absorbed by said array of solar cells and thereby converted into electricity.

15. A solar energy concentrator comprising:
a substantially flat waveguide arrangement having a longitudinal core axis and having at least one light input and being configured to provide radiation propagation the longitudinal core axis by effect of total internal reflection, the waveguide arrangement comprising:
a core unit for passing input solar radiation received from the light input along the longitudinal core axis of said core unit; and
a cladding material arrangement interfacing with the core unit along said longitudinal core axis of the core unit, said cladding material arrangement being configured as an array of spaced-apart solar cells having different band gaps and arranged in a descending order of their optical absorption energy threshold having a refractive index gradient along the longitudinal core axis of said core unit, thereby spectrally splitting the photons of the input solar radiation by causing the photons of different wavelengths, while passing through the core unit, to be successively absorbed and thereby collected at the different refractive index regions of the cladding material arrangement.

16. A method for optimizing conversion of solar energy into electricity; said method comprising directing an incoming radiation into a substantially flat waveguide arrangement, the waveguide arrangement comprising a core unit for passing input solar radiation, received from the light input, along a longitudinal core axis of said core unit and a cladding material arrangement interfacing with the core unit along said longitudinal core axis of the core unit, said cladding material arrangement being configured as an array of spaced-apart solar cells having different band gaps and arranged in a descending order of their optical absorption energy threshold having a refractive index gradient along the longitudinal core axis of said core unit to thereby successively interact with the radiation passing through said core unit along the longitudinal core axis, such that the different refractive index regions of the cladding material arrangement being associated with different solar cells, respectively, to thereby spectrally split photons of the input solar radiation while propagating through the core unit along the longitudinal core axis by causing each of the solar cells to absorb photons of a different wavelength, while reflecting photons of other wavelengths to allow their interaction with successive solar cells, resulting in that the input solar radiation is successively absorbed by said array of solar cells and thereby converted into electricity; thereby enabling maximization of the efficiency conversion process in which the energy spectrum of the solar radiation is absorbed by the surrounding solar cells.

17. The method of claim 16 comprising guiding different fractions of incoming radiation having different wavelength range to different solar cells.

18. The method of claim 17, wherein said waveguide arrangement is optically inhomogeneous such that the radiation is directed to the different solar cells.

19. The method of claim 17, comprising providing spatial spectrum splitting.

20. The method of claim 19, wherein said waveguide arrangement is configured as series of prisms.

21. The method of claim 19, wherein said spectral splitting is provided by a dichroic mirror.

22. The method of claim 16, comprising selectively modifying parameters selected from the relative refractive indexes at said waveguide-solar cell interface, the band gap of said solar cells, the length of each solar cell and the absorption window to optimize the absorption of the incoming radiation.

23. The method of claim 22, wherein the relative refractive indexes at said waveguide-solar cell interface is varied by different optical coupling coating between said waveguide and said solar cells.

24. The method of claim 16, comprising spectral splitting of said incoming radiation into several windows of energy ranges by a gradual variation of the waveguide refractive index.

25. The method of claim 24, comprising selectively modifying the waveguide refractive index in the direction perpendicular to that of the incoming radiation towards a given wavelength.

26. The method of claim 16, comprising directing the radiation onto an additional solar cell attached to said waveguide arrangement at an optimal angle to the other cells with lowest optical absorption threshold optimized for collecting the remaining radiation.

27. The method of claim 16, wherein said radiation is directed into the waveguide arrangement via mirrors or lenses.

28. The method of claim 16, wherein said waveguide arrangement comprises a plurality of waveguides folded in multiple sheets or rolled in a spiral.

29. The method of claim 28, wherein said sheets or rolls are encapsulated in vacuum or inert gas.

30. The method of claim 28, wherein said sheets or rolls are encapsulated in electrolyte forming an electrochemical system.

31. The method of claim 16, wherein said solar cells have independent electrical circuits to decrease electrical losses and eliminate the current matching between said solar cells.

* * * * *

UNITED STATES PATENT AND TRADEMARK OFFICE
CERTIFICATE OF CORRECTION

PATENT NO. : 8,354,583 B2  
APPLICATION NO. : 12/301399  
DATED : January 15, 2013  
INVENTOR(S) : Arie Zaban et al.

Page 1 of 1

It is certified that error appears in the above-identified patent and that said Letters Patent is hereby corrected as shown below:

In claim 1 (Col. 11, line 22): "photons of a different wavelengths" should be amended to read --photons of different wavelengths--;

In claim 3 (Col. 11, line 34): "core unit d the cladding material" should be amended to read --core unit and the cladding material--;

In claim 8 (Col. 11, line 52): "V-shaped grove" should be amended to read --V-shaped groove--; and In claim 15 (Col. 12, lines 39-40): "propagation the longitudinal core axis" should be amended to read --propagation along the longitudinal core axis--.

Signed and Sealed this
Second Day of April, 2013

Teresa Stanek Rea
*Acting Director of the United States Patent and Trademark Office*